US012143071B2

(12) United States Patent
Zhang et al.

(10) Patent No.: US 12,143,071 B2
(45) Date of Patent: Nov. 12, 2024

(54) TRIMMING CIRCUIT OF DIFFERENTIAL AMPLIFIER

(71) Applicant: SHANGHAI ANALOGY SEMICONDUCTOR TECHNOLOGY LTD., Shanghai (CN)

(72) Inventors: Jun Zhang, Shanghai (CN); Zhian Zhang, Shanghai (CN)

(73) Assignee: Shanghai Analogy Semiconductor Technology Ltd., Shanghai (CN)

( * ) Notice: Subject to any disclaimer, the term of this patent is extended or adjusted under 35 U.S.C. 154(b) by 278 days.

(21) Appl. No.: 17/437,694

(22) PCT Filed: Jul. 12, 2019

(86) PCT No.: PCT/CN2019/095863
§ 371 (c)(1),
(2) Date: Sep. 9, 2021

(87) PCT Pub. No.: WO2020/258369
PCT Pub. Date: Dec. 30, 2020

(65) Prior Publication Data
US 2022/0166390 A1    May 26, 2022

(30) Foreign Application Priority Data

Jun. 28, 2019    (CN) .......................... 201910573193.2

(51) Int. Cl.
*H03F 3/45*    (2006.01)
*H03F 1/56*    (2006.01)

(52) U.S. Cl.
CPC ........... *H03F 1/56* (2013.01); *H03F 3/45475* (2013.01); *H03F 2203/45624* (2013.01)

(58) Field of Classification Search
CPC ................... H03F 1/56; H03F 3/45475; H03F 2203/45624; H03F 2203/45048; H03F 1/083; H03F 3/45479
(Continued)

(56) References Cited

U.S. PATENT DOCUMENTS

| 9,866,236 B1 | 1/2018 | Chao et al. |
| 2011/0163807 A1 | 7/2011 | Li et al. |
| 2019/0199305 A1* | 6/2019 | Sugie ................. H02K 41/0354 |

FOREIGN PATENT DOCUMENTS

| CN | 101330291 | 12/2008 |
| CN | 101330291 A | 12/2008 |

(Continued)

OTHER PUBLICATIONS

CNIPA, Office Action issued Jul. 1, 2020, for CN Application No. 201910573193. 2, including English translation, 10 pages.
(Continued)

*Primary Examiner* — Andrea Lindgren Baltzell
*Assistant Examiner* — Khiem D Nguyen
(74) *Attorney, Agent, or Firm* — Fish & Richardson P.C.

(57) ABSTRACT

The present application discloses a trimming circuit of differential amplifier, wherein an output end of the differential amplifier is coupled to a first input end of the differential amplifier through a first voltage-dividing resistor; a shift voltage is coupled to a second input end of the differential amplifier through a second voltage-dividing resistor; the first voltage-dividing resistor and the second voltage-dividing resistor respectively form a T-shaped resistor network structure; the T-shaped resistor network structure comprises: a k-bit resistive network coupled to a T-shaped node and a reference power supply end, wherein a low n-bits of the k-bit resistive network is an R-2R resistive network, and part of branches are connected in series with (Continued)

at least one trimming resistor, and each trimming resistor is connected in parallel with a switch.

9 Claims, 9 Drawing Sheets

(58) Field of Classification Search
USPC .................................................. 330/252, 86
See application file for complete search history.

(56) References Cited

FOREIGN PATENT DOCUMENTS

| CN | 107786203 | 3/2018 |
|----|-----------|--------|
| CN | 108551343 | 9/2018 |
| CN | 208351358 U | 1/2019 |
| CN | 109586725 | 4/2019 |
| JP | S59165509 A | 9/1984 |
| JP | H11317019 A | 11/1999 |

OTHER PUBLICATIONS

CNIPA, Office Action issued Sep. 9, 2020, for CN Application No. 201910573193. 2, including English translation, 13 pages.

CNIPA, Notification of Grant issued Nov. 2, 2020, for CN Application No. 201910573193. 2, 1 page.

International Preliminary Report on Patentability in International Appln. No. PCT/CN2019/095863, issued on Dec. 28, 2021, 10 pages (with English translation).

International Search Report and Written Opinion in International Appln. No. PCT/CN2019/095863, mailed on Mar. 27, 2020, 14 pages (with English translation).

* cited by examiner

TRIMMING CIRCUIT OF DIFFERENTIAL AMPLIFIER

TECHNICAL FIELD

The present invention generally relates to the field of electronic technology, and particularly relates to a trimming circuit of differential amplifier.

BACKGROUND

With the rapid development of electronic technology, operational amplifier circuits have been widely used. There are many types of integrated operational amplifiers. As high-performance amplifier, instrumentation amplifier is popular in data acquisition, sensor signal amplification, high-speed signal conditioning, medical instruments, and high-grade audio equipment. The instrumentation amplifier integrates key components inside the amplifier, with a specific structure to achieve high common-mode rejection ratio, high input impedance, low noise, low linearity error, low offset drift, and has the characteristics of flexible gain setting and convenient use.

Differential amplifier is regarded as the core structural unit in the instrument amplifier, its typical circuit block diagram is shown as in FIG. 1. An output terminal OUT of the differential amplifier is coupled to an inverting input terminal of the differential amplifier through voltage-dividing resistors R1, R2, and a shift level Vshift is coupled to an in-phase input terminal of the differential amplifier through voltage-dividing resistors R4, R3. Direct current level of the output voltage can be set by adjusting the shift Level Vshift. Generally, resistance value of R3 is equal to R2, and R4 is equal to R1, so that a ratio of the voltage-dividing resistors determines the magnitude of the differential voltage gain, and the ratio of the voltage-dividing resistors between the in-phase input terminal and the inverting input terminal determines the magnitude of the common-mode rejection ratio. Generally, the gain error can be corrected by modifying the input stage of the instrumentation amplifier, and the match of the resistive network ratio of the differential amplifier limits the final performance of the common-mode rejection ratio of the entire instrumentation amplifier.

An existing method for adjusting the common-mode rejection ratio of the differential amplifier is shown in FIG. 1. The resistance values of the resistors R1 and R4 are adjusted to make the ratios of the two voltage-dividing resistors equal, thereby improving the common-mode rejection ratio of the differential amplifier. Because instrumentation amplifiers require very high precision for common-mode rejection ratio, the minimum trimming precision of trimming resistors is very small, which is usually only a few ohms. It is difficult for general digital trimming methods to achieve such small precision requirement, and requires laser trimming method to achieve this precision requirement. The existing trimming methods not only greatly increase the cost of the circuit, but also increase the cost of testing and trimming time. Moreover, because the laser trimming can only be performed before chip packaging, errors caused by factors such as stress generated during the packaging process cannot be corrected, which affects the final performance of the differential amplifier.

SUMMARY OF THE INVENTION

The purpose of the present invention is to provide a trimming circuit of differential amplifier, which reduces the circuit cost and improves the testing and trimming time.

In order to solve the above-mentioned problems, this application discloses a trimming circuit of differential amplifier, comprising:
- an output terminal of the differential amplifier is coupled to a first input terminal of the differential amplifier through a first voltage-dividing resistor;
- a shift voltage is coupled to a second input terminal of the differential amplifier through a second voltage-dividing resistor;
- the first voltage-dividing resistor and the second voltage-dividing resistor are respectively formed to be a T-shaped resistor network structure;
- the T-shaped resistor network structure comprises:
  - a k-bit resistive network coupled to a T-shaped node and a reference power supply terminal, wherein a low n-bits of the k-bit resistive network is an R-2R resistive network, and part of branches of the low n-bits are connected in series with at least one trimming resistor, and each trimming resistor is connected in parallel with a switch.

In a preferred embodiment, a high (k−n)-bits of the k-bit resistive network is an R-2R resistive network, and branches of the low n-bits are connected in series with one trimming resistor, and resistance values of the trimming resistors are sequentially set to $Rtrim/2^{n-1}$, wherein k≥n.

In a preferred embodiment, a high (k−n)-bits of the k-bit resistive network is an R-2R resistive network, and at least part of branches of the low n-bits are connected in series with three trimming resistors with identical resistance value, wherein n≥k/2.

In a preferred embodiment, a high (k−n)-bits of the k-bit resistive network is an R-2R resistive network, and at least part of branches of the low n-bits are connected in series with different bits trimming resistors with different resistance values.

In a preferred embodiment, the low n-bits of the k-bit resistive network is an R-2R resistive network, and a high (k−n)-bits of the k-bit resistive network is a plurality of resistors connected in parallel.

In a preferred embodiment, the low n-bits of the k-bit resistive network is an R-2R resistive network, and a high (k−n)-bits of the k-bit resistive network is a plurality of resistors connected in parallel and each branch of the high (k−n)-bits is connected in series with different bits trimming resistors, and each trimming resistor is connected in parallel with a switch.

In a preferred embodiment, the switch is a MOS transistor.

In a preferred embodiment, the T-shaped resistor network structure of the first voltage-dividing resistor further comprises: a first resistor connected between the T-shaped node and the first input terminal; and a fifth resistor connected between the T-shaped node and the output terminal.

In a preferred embodiment, the T-shaped resistor network structure of the second voltage-dividing resistor further comprises: a fourth resistor connected between the T-shaped node and the second input terminal; and a seventh resistor connected between the T-shaped node and the shift voltage.

In a preferred embodiment, further comprising: a polarity control bit, wherein when the polarity control bit is at 0, the first voltage-dividing resistor is adjusted; and when the polarity control bit is at 1, the second voltage-dividing resistor is adjusted.

Compared with the prior art, the trimming circuit of differential amplifier of the present application has at least the following beneficial effects:

1) The implementation of the present application adopts an all-digital trimming method and does not require traditional laser trimming, thereby reducing the circuit cost and the testing and trimming cost, and solving the problem that the errors caused the packaging process cannot be adjusted.
2) Compared with the traditional digital trimming resistor DAC structure, the implementation of the present application requires a smaller trimming resistor range, fewer switches, and lower circuit cost.
3) In the structure adopted in the implementation of this specification, one terminal of the switch is always coupled to a fixed level (usually ground level), so that the on-resistance of each switch is basically equal. The switch is usually realized by a MOS transistor of which bottom effect is eliminated, so that the final performance of the trimming circuit is better.
4) The structure of the trimming circuit in present application is flexible and changeable, and can be applied to many other occasions that need trimming, such as the offset voltage trimming of the operational amplifier.

A large number of technical features are described in the specification of the present application, and are distributed in various technical solutions. If a combination (i.e., a technical solution) of all possible technical features of the present application is listed, the description may be made too long. In order to avoid this problem, the various technical features disclosed in the above summary of the present application, the technical features disclosed in the various embodiments and examples below, and the various technical features disclosed in the drawings can be freely combined with each other to constitute Various new technical solutions (all of which are considered to have been described in this specification), unless a combination of such technical features is not technically feasible. For example, feature A+B+C is disclosed in one example, and feature A+B+D+E is disclosed in another example, while features C and D are equivalent technical means that perform the same function, and technically only choose one, not to adopt at the same time. Feature E can be combined with feature C technically. Then, the A+B+C+D scheme should not be regarded as already recorded because of the technical infeasibility, and A+B+C+E scheme should be considered as already documented.

BRIEF DESCRIPTION OF THE FIGURES

Non-limiting and non-exhaustive embodiments of the present application are described with reference to the following drawings, where like reference numerals refer to like parts throughout the various views unless otherwise specified.

DETAILED DESCRIPTION

Various aspects and examples of the present application will now be described. The following description provides specific details for a thorough understanding and enabling description of these examples. Those skilled in the art will understand, however, that the disclosure may be practiced without many of these details.

Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples. Certain terms may even be emphasized below, however, any terminology intended to be interpreted in any restricted manner will be overtly and specifically defined as such in this Detailed Description section.

Figure 1:
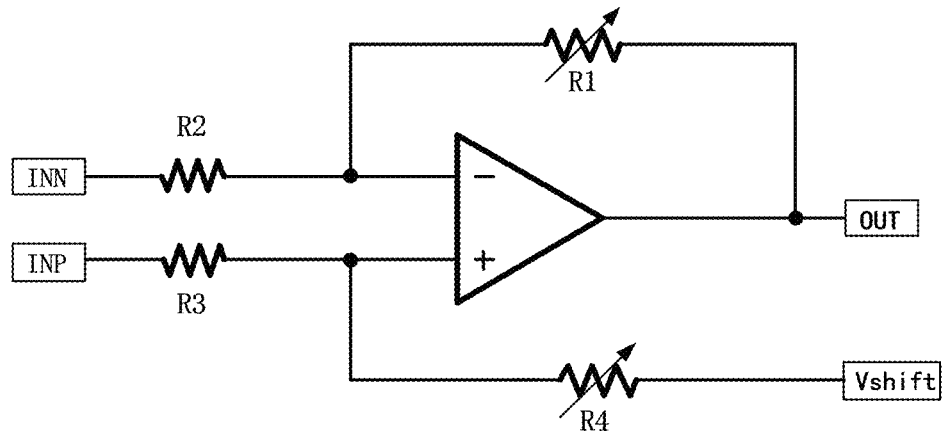
FIG. 1 shows a circuit diagram of a differential amplifier and trimming resistors thereof.
Figure 2:
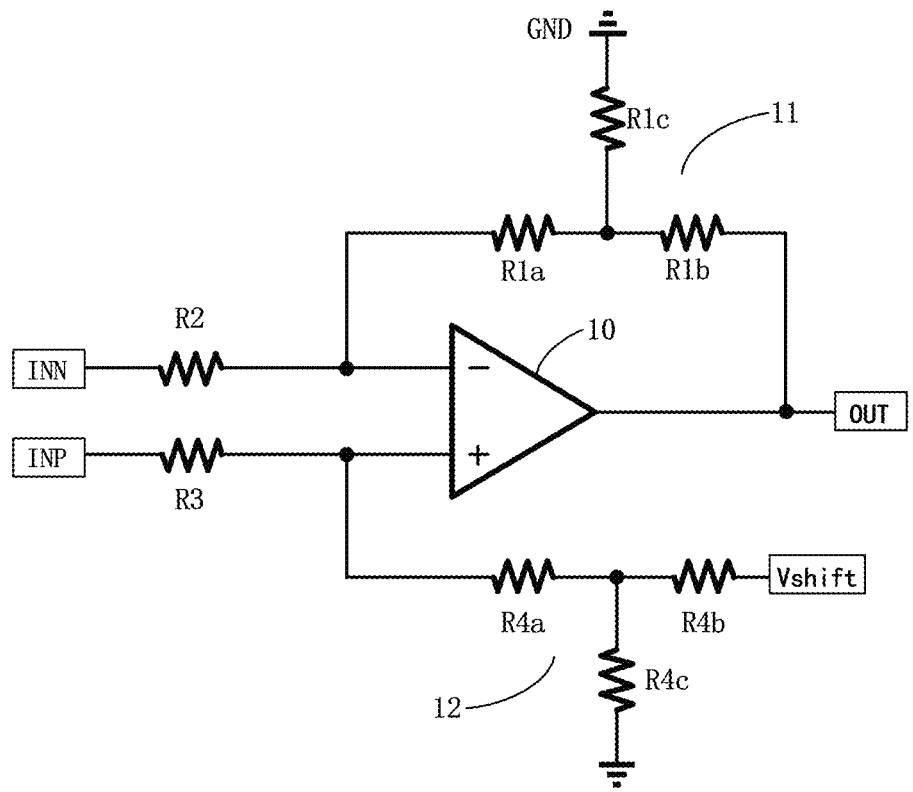
FIG. 2 shows a block diagram of a differential amplifier and trimming circuit thereof in an embodiment of the present invention.

An embodiment of the present application provides a trimming circuit of differential amplifier. FIG. 2 shows a circuit diagram of the trimming circuit of differential amplifier disclosed in this embodiment. An output terminal OUT of the differential amplifier 10 is coupled to a first input terminal (i.e., inverting input terminal) of the differential amplifier 10 through a first voltage-dividing resistor 11; a shift voltage Vshift is coupled to a second input terminal (i.e., in-phase input terminal) of the differential amplifier 10 through a second voltage-dividing resistor 12; the first voltage-dividing resistor 11 and the second voltage-dividing resistor 12 are respectively formed to be a T-shaped resistor network structure; a first input signal INN is coupled to the first input terminal through a second resistor R2, a second input signal INP is coupled to the second input terminal through a third resistor R3. The first voltage-dividing resistor 11 comprises a first resistor R1a, a fifth resistor R1b, and a sixth resistor R1c. The second voltage-dividing resistor 12 comprises a fourth resistor R4a, a seventh resistor R4b, and an eighth resistor R4c.

The T-shaped resistor network structure refers to: the first resistor R1a, the fifth resistor R1b, and the sixth resistor R1c including in the first voltage-dividing resistor 11 are coupled to a common T-shaped node; or the fourth resistor R4a, the seventh resistor R4b, and the eighth resistor R4c including in the voltage-dividing resistor 12 are coupled to a common T-shaped node.

Figure 3:
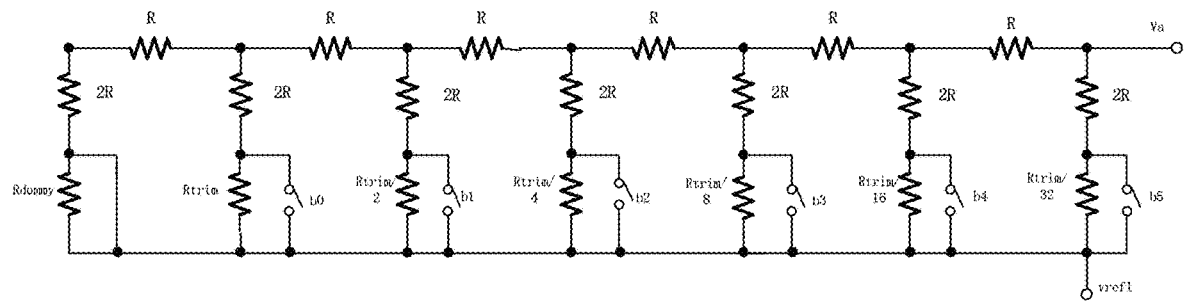
FIG. 3 shows a circuit diagram of a resistive network in another embodiment of the present invention.

The T-shaped resistor network structure comprises: a k-bit resistive network coupled to a T-shaped node and a reference power supply terminal (for example, a ground terminal). A low n-bits of the k-bit resistive network is an R-2R resistive network, and at least part of branches of the low n-bits are connected in series with at least one trimming resistor, each trimming resistor is connected in parallel with a switch. In other words, the sixth resistor R1c of the first voltage-dividing resistor 11 and the eighth resistor R4c of the second voltage-dividing resistor 12 are k-bit resistive networks. Wherein, k is a positive integer greater than or equal to 1, for example, k=3, 6, 8, 10, etc., and k≥n, for example, n=1, 3, 6, 8, etc. It should be understood that k is the adjustable bit number of the resistive network. FIG. 3 only shows a resistive network that implements 6-bit trimming. In another embodiment, it can be extended to 10-bit, 16-bit, 64-bit, 1024-bit, etc. The R-2R resistive network refers to a Π-shaped resistor network structure formed with a resistance value of R and a resistance value of 2R between a power supply terminal and a reference power supply terminal.

In an embodiment, the trimming circuit further comprises: a polarity control bit (not shown in the figure), when the polarity control bit is at 0, the first voltage-dividing resistor 11 is adjusted; and when the polarity control bit is at 1, the second voltage-dividing resistor 12 is adjusted.

FIG. 3 shows a circuit diagram of a resistive network of a T-shaped resistor network structure in the trimming circuit of an embodiment. In an embodiment, the low n-bits of the k-bit resistive network is an R-2R resistive network, and the high (k−n)-bits of the k-bit resistive network is also an R-2R resistive network, so that the k-bit resistive network is an R-2R resistive network, and branches of the low n-bits are respectively connected in series with one trimming resistor, and resistance values of the trimming resistors are sequentially set to $Rtrim/2^{n-1}$, wherein k≥n. In addition, branches of the high (k−n)-bits are connected in series with one trimming resistor, resistance values of the trimming resistors are sequentially set to $Rtrim/2^{k-1}$, and each trimming resistor is connected in parallel with a switch, for example, k=6 and n=6. Wherein, Va is coupled to the T-shaped node, and Vref is coupled to the ground.

Figure 4:
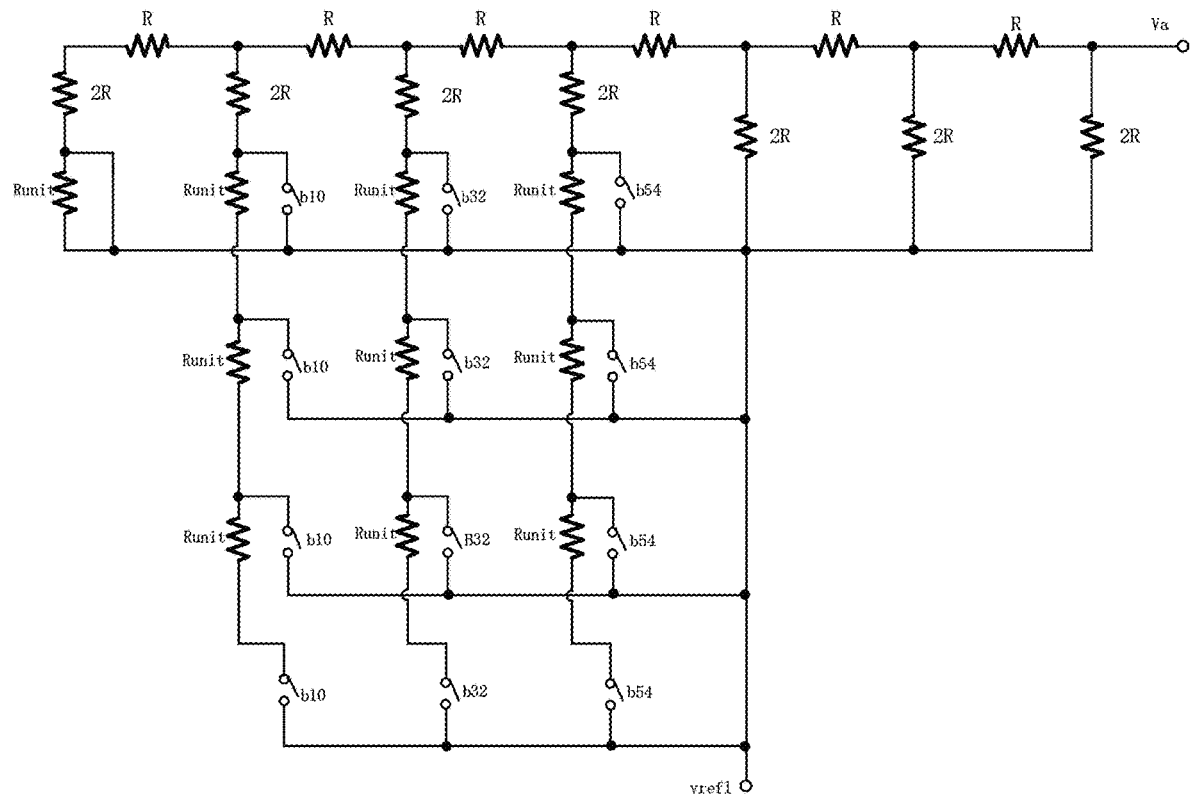
FIG. 4 shows a circuit diagram of a resistive network in another embodiment of the present invention.

FIG. 4 shows a circuit diagram of a resistive network of the T-shaped resistive network structure in the trimming circuit of another embodiment. In an embodiment, the low n-bits of the k-bit resistive network is an R-2R resistive network, and branches of the low n-bits are respectively connected in series with multiple (for example, 3 bits) trimming resistors with identical resistance value. The high (k−n)-bits of the k-bit resistive network is also an R-2R resistive network, and each branch does not need to be connected in series with trimming resistor. Wherein, n≥k/2, for example, k=6, n=3. Compared with the resistive network shown in FIG. 3, the resistive network in FIG. 4 only selects a plurality of branches in the low n-bits to connect in series with trimming resistors, and the resistance values of the trimming resistors are all identical, for example, the resistance value is Runit, thereby reducing the range of the trimming resistor, and achieving very high trimming accuracy with minimal cost.

In an embodiment, the high (k−n)-bits in the k-bit resistive network is an R-2R resistive network, and at least part of branches of the low n-bits are respectively connected in series with different bits trimming resistors with different resistance values, and the trimming resistors are respectively connected in parallel with a switch. In an embodiment, the high (k−n)-bits of the k-bit resistive network is an R-2R resistive network, and each branch is respectively connected in series with different bits trimming resistors with different resistance values.

Figure 5:
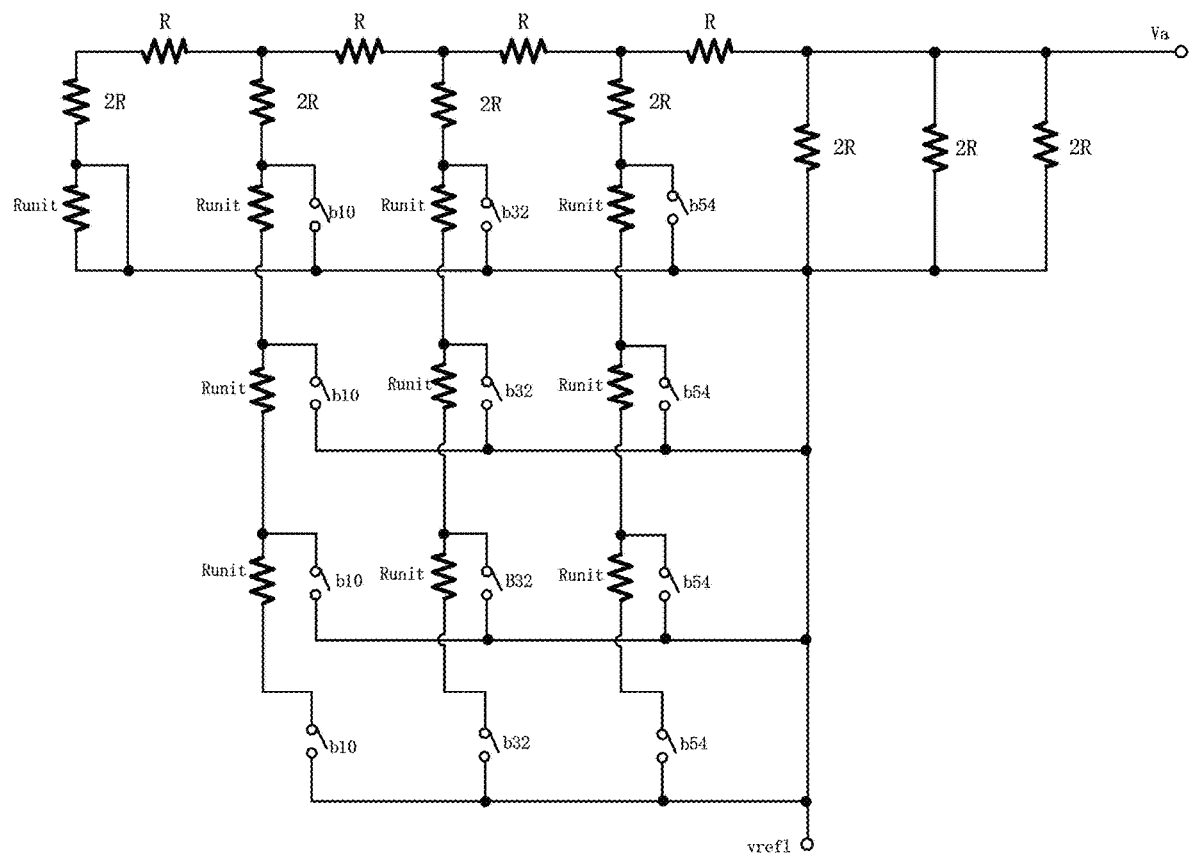
FIG. 5 shows a circuit diagram of a resistive network in another embodiment of the present invention.

FIG. 5 shows a circuit diagram of a resistive network of the T-shaped resistive network structure in the trimming circuit of another embodiment. In an embodiment, the low n-bits of the k-bit resistive network is an R-2R resistive network, and branches of the low n-bits are respectively connected in series with 3-bit trimming resistors with identical resistance, for example, the resistance value is Runit, and the high (k−n)-bits of the k-bit resistive network are a plurality of resistors connected in parallel. For example, the high (k−n)-bits of the k-bit resistive network is multi-level resistors with a resistance value of 2R in parallel.

Figure 6:
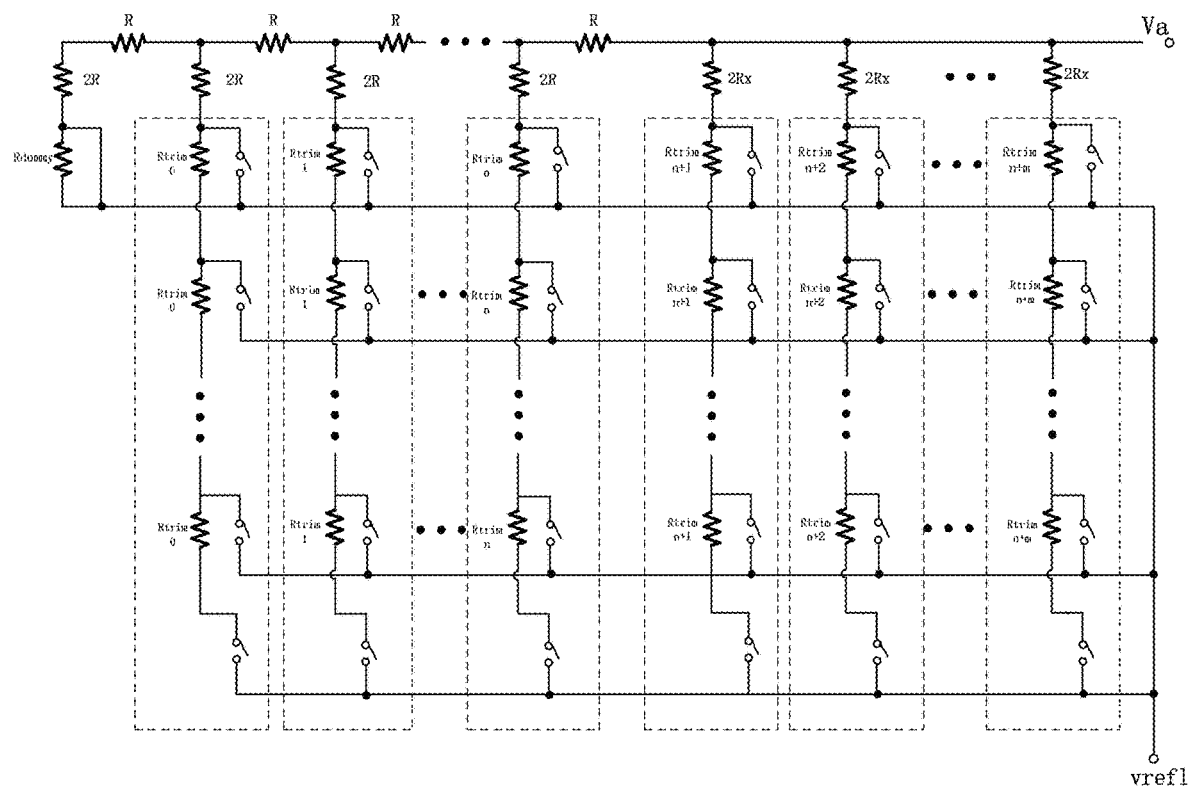
FIG. 6 shows a circuit diagram of a resistive network in another embodiment of the present invention.

FIG. 6 shows a circuit diagram of a resistive network of the T-shaped resistive network structure in the trimming circuit of another embodiment. In an embodiment, the low n-bits of the k-bit resistive network is an R-2R resistive network, and branches of the low n-bits are respectively connected in series with at least one bit trimming resistor, and the high (k−n)-bits of the k-bit resistive network are a plurality of resistors connected in parallel (m-bit shown in the figure), and each branch is connected in series with different bits trimming resistors, and the trimming resistor is connected in parallel with a switch.

In an embodiment, the low n-bits of the k-bit resistive network are connected in series with different bits trimming resistors, and the number of trimming resistors connected in series in each branch may not need to be the same. For example, 6 trimming resistors are connected in series in the first branch, 3 trimming resistors are connected in series in the second branch, and there are no trimming resistors connected in the other branches; or, 3 trimming resistors are connected in series in the first branch, and 6 trimming resistors are connected in series in the third branch, and there are no trimming resistors connected in the other branches.

In an embodiment, the high (k−n)-bits of the k-bit resistive network is an R-2R resistive network, and are respectively connected in series with different bits trimming resistors, and the number of trimming resistors connected in series in each branch may not need to be the same. For example, 6 trimming resistors are connected in series in the (k−1)th branch, 3 trimming resistors are connected in series in the (k−2)th branch, and there are no trimming resistors connected in the other branches; or, 3 trimming resistors are connected in series in the (k−1)th branch, and 6 trimming resistors are connected in series in the (k−3)th branch, and there are no trimming resistors connected in the other branches.

The implementation of the present application adopts an all-digital trimming method and does not require traditional laser trimming, thereby reducing the circuit cost and the testing and trimming cost, and solving the problem that the errors caused the packaging process cannot be adjusted. Compared with the traditional digital trimming resistor DAC structure, the implementation of the present application requires a smaller trimming resistor range, fewer switches, and lower circuit cost. The structure of the trimming circuit in present application is flexible and changeable, and can be applied to many other occasions that need trimming, such as the offset voltage trimming of the operational amplifier.

In an embodiment, the switch is a MOS transistor. One terminal of the switch is always coupled to a fixed level (usually ground), so that the on-resistance value of each switch is basically equal. The switch is usually realized by a MOS transistor of which bottom effect is eliminated, so that the final performance of the trimming circuit is better.

In order to better understand the technical solutions of this specification, the following description will be given with a specific embodiment. The details listed in this embodiment are mainly for ease of understanding and are not intended to limit the scope of protection of this application.

Figure 7:
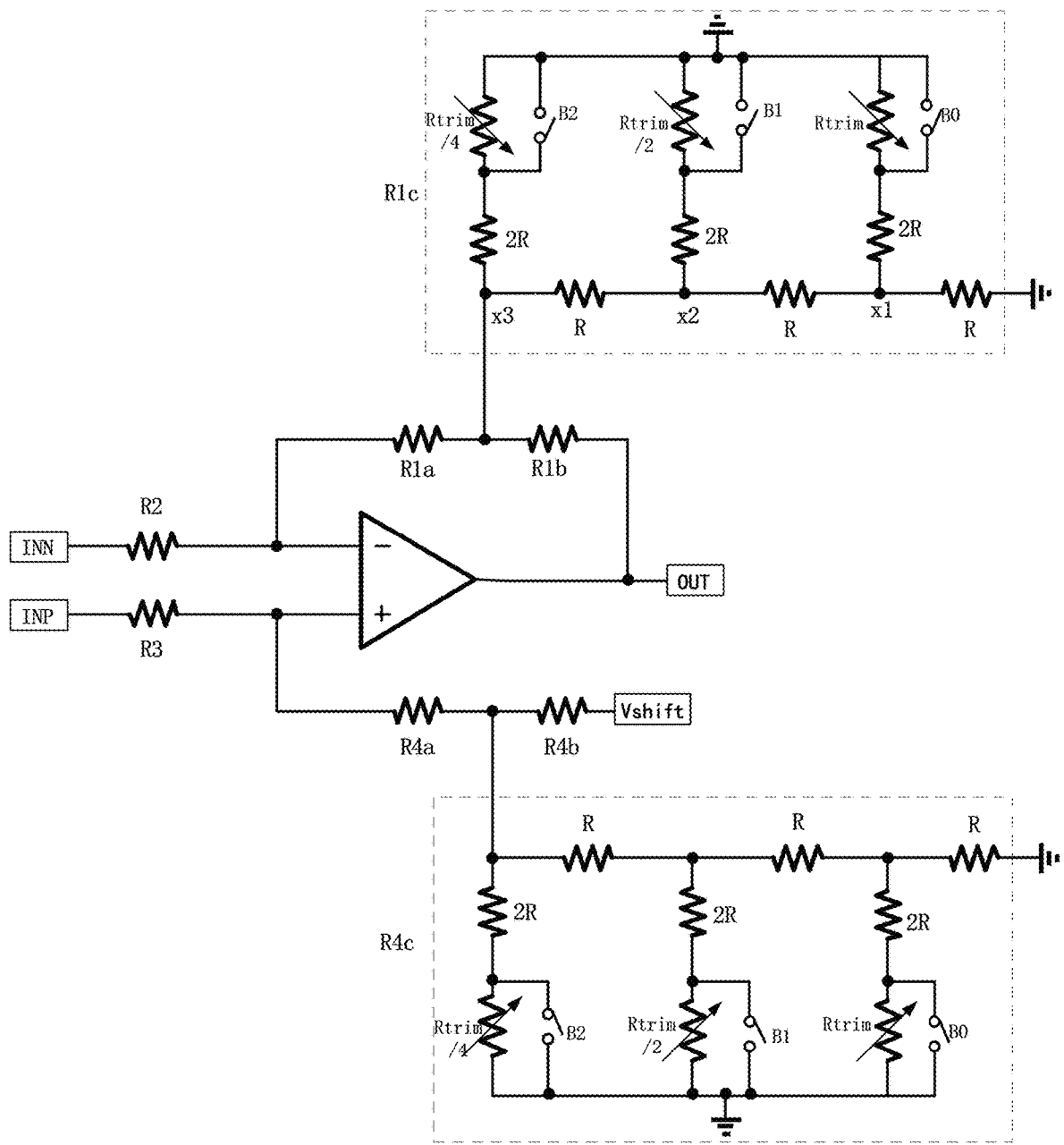
FIG. 7 shows a circuit diagram of a differential amplifier and trimming circuit thereof in an embodiment of the present invention.

FIG. 7 shows a specific circuit diagram of a trimming circuit of differential amplifier disclosed in this embodiment. The k-bit resistive network is an R-2R resistive network. For example, the T-shaped resistor network structure comprises a 3-bit R-2R resistive network, and each branch of the R-2R resistive network is connected in series with one bit trimming resistor, the resistance values of the trimming resistors are sequentially set to $R/2^{k-1}$. For example, a first branch of the R-2R resistive network is connected in series with a resistor with Rtrim resistance value which is connected in parallel with a switch B0, a second branch of the R-2R resistive network is connected in series with a resistor with Rtrim/2 resistance value which is connected in parallel with a switch B1, and a third branch of the R-2R resistive network is connected in series with a resistor with Rtrim/4 resistance value which is connected in parallel with a switch B2. FIG. 7 only shows a resistive network that implements 3-bit trimming. In another embodiment, it can be extended to 6-bit, 9-bit, 10-bit, 1024-bit, etc. However, as the trimming bit number increases, the range of the trimming resistance increases, and its implementation cost also increases.

The switch states of the switches B0, B1, and B2 of the resistive network as shown in FIG. 7 are recorded as 000~111 in binary code which are corresponding to 8 different states, wherein 0 means the switch is turned off and 1 means the switch is turned on. In an embodiment, the trimming circuit further comprises: a polarity control bit B4 (not shown in the figure), when the polarity control bit is at 0, the first voltage-dividing resistor 11 is adjusted; and when the polarity control bit is at 1, the second voltage-dividing resistor 12 is adjusted. The trimming resistor has a 4-bit digital signals which are denoted as code=0, 1, 2, 3 . . . 15. The equivalent resistance value of the first branch of the resistive network is R1$x$, the equivalent resistance value of the second branch is Rx2, and the equivalent resistance value of the third branch is Rx3.

$$R \times 1(\text{code}) = \frac{2R \times (2R + Rtrim \times b0(\text{code}))}{2R + 2R + Rtrim \times b0(\text{code})}$$

$$R \times 2(\text{code}) = \frac{\left(2R + \frac{Rtrim}{2} \times b1(\text{code})\right) \times (R + R \times 1(\text{code}))}{2R + \frac{Rtrim}{2} \times b1(\text{code}) + R + R \times 1(\text{code})}$$

$$R \times 3(\text{code}) = \frac{\left(2R + \frac{Rtrim}{4} \times b2(\text{code})\right) \times (R + R \times 2(\text{code}))}{2R + \frac{Rtrim}{4} \times b2(\text{code}) + R + R \times 2(\text{code})}$$

Figure 8:
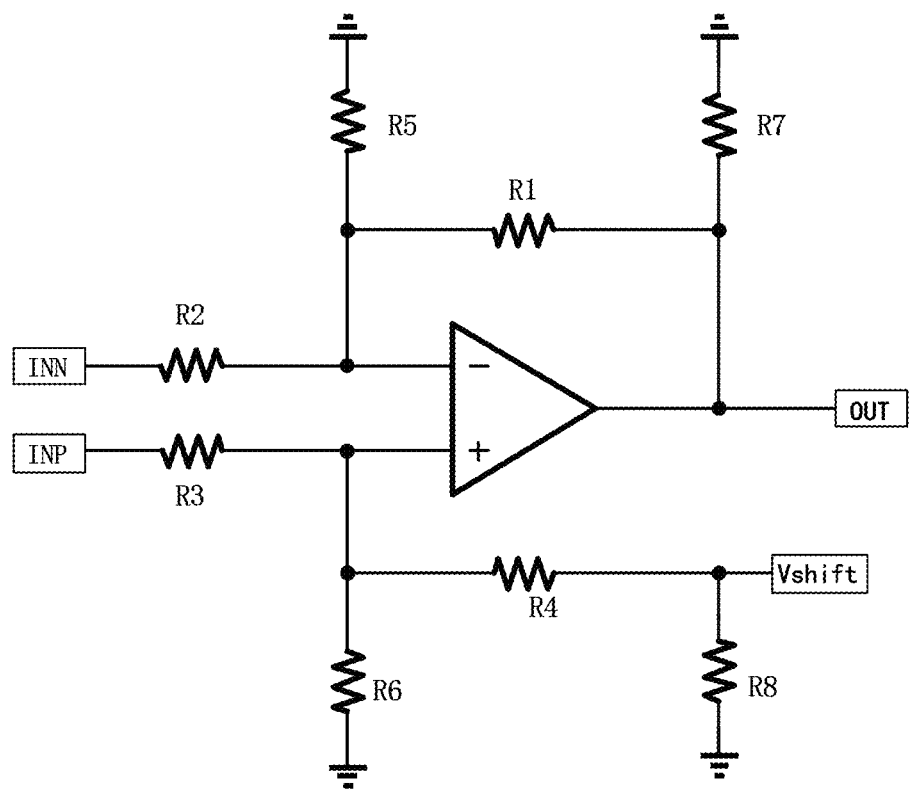
FIG. 8 shows an equivalent circuit diagram of a differential amplifier and trimming circuit thereof in an embodiment of the present invention.

In the process of calculating the differential gain Gain_diff_mode, the common-mode gain Gain_common_mode and the common-mode rejection ratio CMRR_ratio of the differential amplifier, the T-shaped resistor network structure is converted to a Π-shaped resistor network structure. FIG. 8 shows a circuit diagram of the Π-shaped resistor network structure. The resistance conversion relationship between the T-shaped resistor network structure and the Π-shaped resistor network structure is shown in the following formula.

$$R5 = R1a + R1c + \frac{R1a \times R1c}{R1b}$$

$$R1 = R1a + R1b + \frac{R1a \times R1b}{R1c}$$

$$R7 = R1b + R1c + \frac{R1b \times R1c}{R1a}$$

$$R6 = R4a + R4c + \frac{R4a \times R4c}{R4b}$$

$$R4 = R4a + R4b + \frac{R4a \times R4b}{R4c}$$

$$R8 = R4b + R4c + \frac{R4b \times R4c}{R4a}$$

Wherein, assuming that the shift voltage Vshift is 0, the calculated results of the differential gain Gain_diff_mode, the common-mode gain Gain_common_mode, and the common-mode rejection ratio CMRR_ratio are as follows:

$$\text{Gain\_diff\_mode} = \frac{1}{2} \frac{R1 \times R3 \times \left(1 + \frac{R4}{R3} + \frac{R4}{R6}\right) + R2 \times R4 \times \left(1 + \frac{R1}{R2} + \frac{R1}{R5}\right)}{R2 \times \left(R3 + R4 + \frac{R3 \times R4}{R6}\right)}$$

$$\text{Gain\_common\_mode} = \frac{R2 \times R4 \times \left(1 + \frac{R1}{R5}\right) - R1 \times R3 \times \left(1 + \frac{R4}{R6}\right)}{R2 \times \left(R3 + R4 + \frac{R3 \times R4}{R6}\right)}$$

$$\text{CMRR\_ratio} = \frac{\text{Gain\_common\_mode}}{\text{Gain\_diff\_mode}}$$

Figure 9:
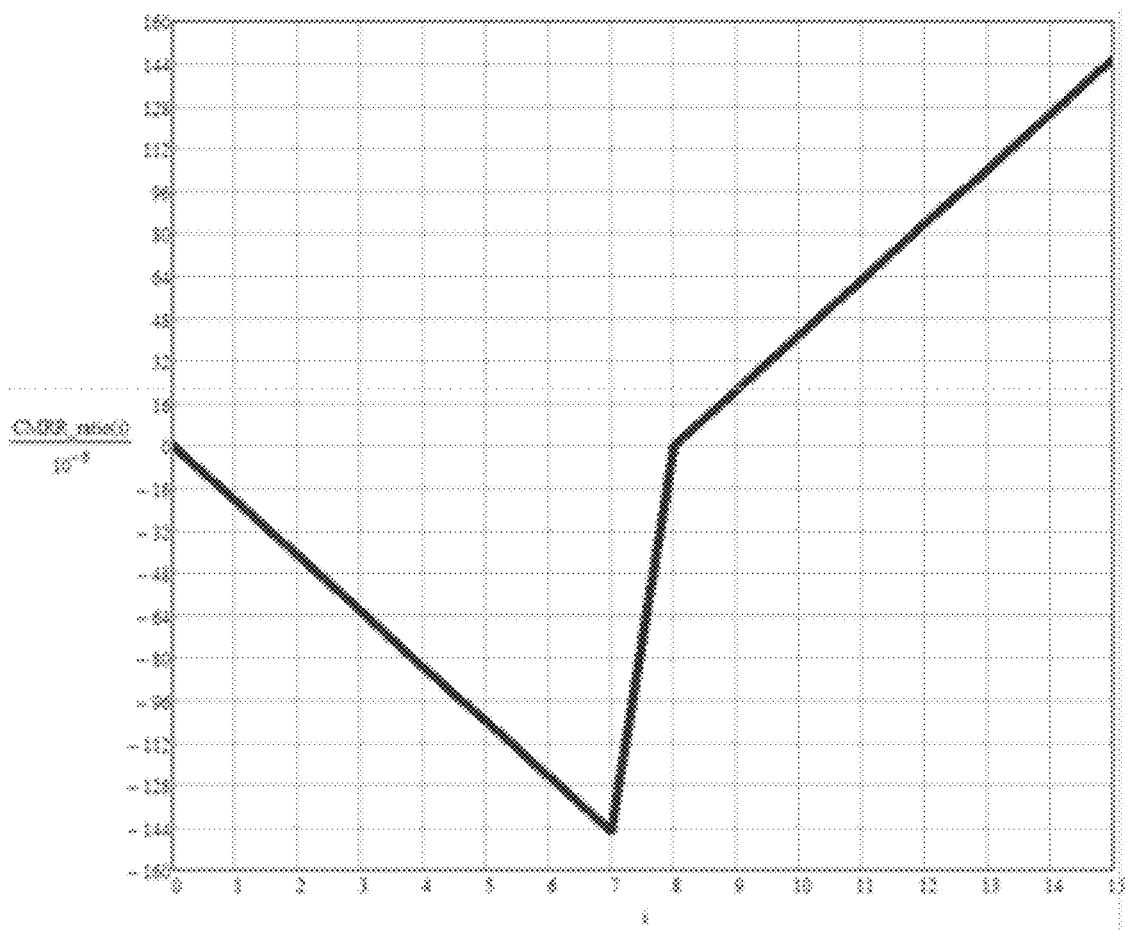
FIG. 9 shows a simulation result diagram of the common-mode rejection ratio in an embodiment of the present invention.

Wherein, selecting R2=R3=300KΩ, R1$a$=R1$b$=R4$a$=R4$b$=50KΩ, R=50KΩ, Rtrim=0.5KΩ. Using mathematical simulation tools, the relationship between the common-mode rejection ratio CMRR_ratio and the digital signal code can be obtained as shown in FIG. 9. Wherein, the common-mode rejection ratio CMRR_ratio is the ordinate, and the digital signal code is the abscissa, and the range of the code is 0 to 15, wherein 0 to 7 represents the change of the common-mode rejection ratio CMRR_ratio when the first voltage-dividing resistor 11 is adjusted, and 7 to 15 represents the change of the common-mode rejection ratio CMRR_ratio when the second voltage-dividing resistor 12 is adjusted. It can be seen from FIG. 9 that regardless of whether the first voltage-dividing resistor 11 or the second voltage-dividing resistor 12 is adjusted, the trimming curve realized by the trimming circuit is very linear.

Figure 10:
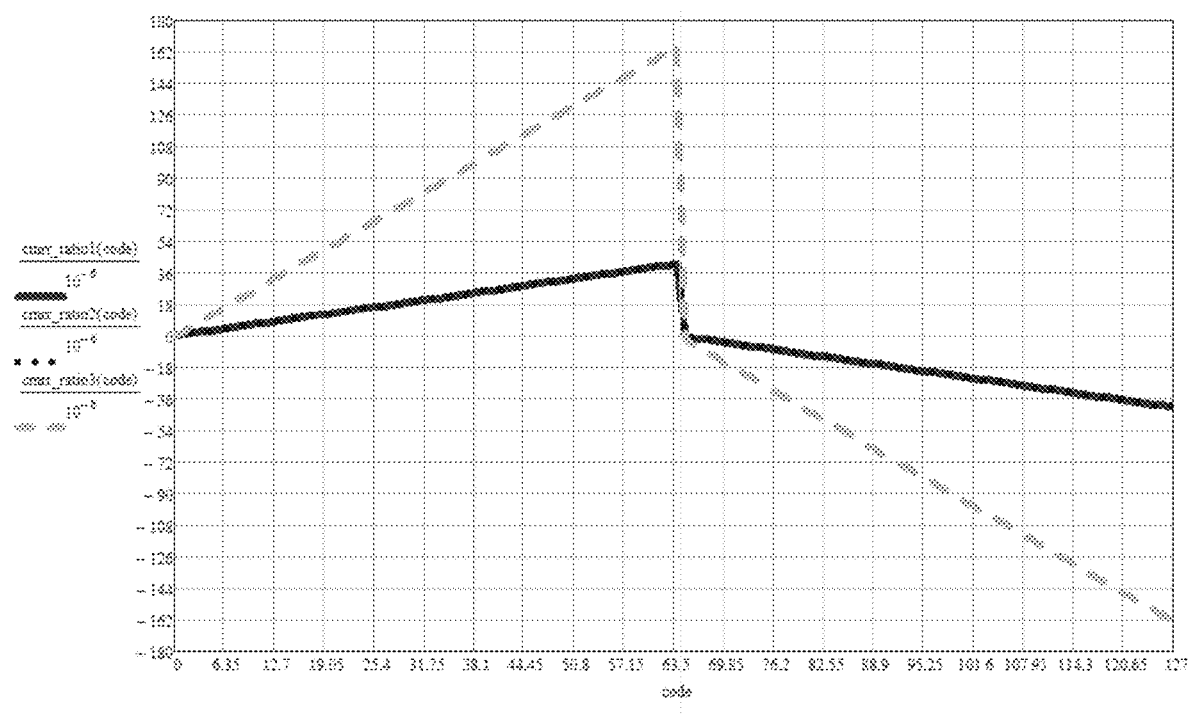
FIG. 10 shows a simulation result diagram of the common-mode rejection ratio in another embodiment of the present invention.

FIG. 10 shows simulation results of the trimming circuit adopting the resistive network shown in FIG. 3, FIG. 4, and FIG. 5. CMRR_ratio1 is the simulation result of the trimming circuit adopting the resistive network shown in FIG. 3, CMRR_ratio2 is the simulation result of the trimming circuit adopting the resistive network shown in FIG. 4, and CMRR_ratio3 is the simulation result of the trimming circuit adopting the resistive network shown in FIG. 5. It can be seen from FIG. 10 that difference between the common-mode rejection ratios of the trimming circuit adopting the resistive network shown in FIG. 3 and FIG. 4 is very small, and the common-mode rejection ratio of the trimming circuit adopting the resistive network shown in FIG. 5 has high sensitivity and high trimming precision.

Figure 11:
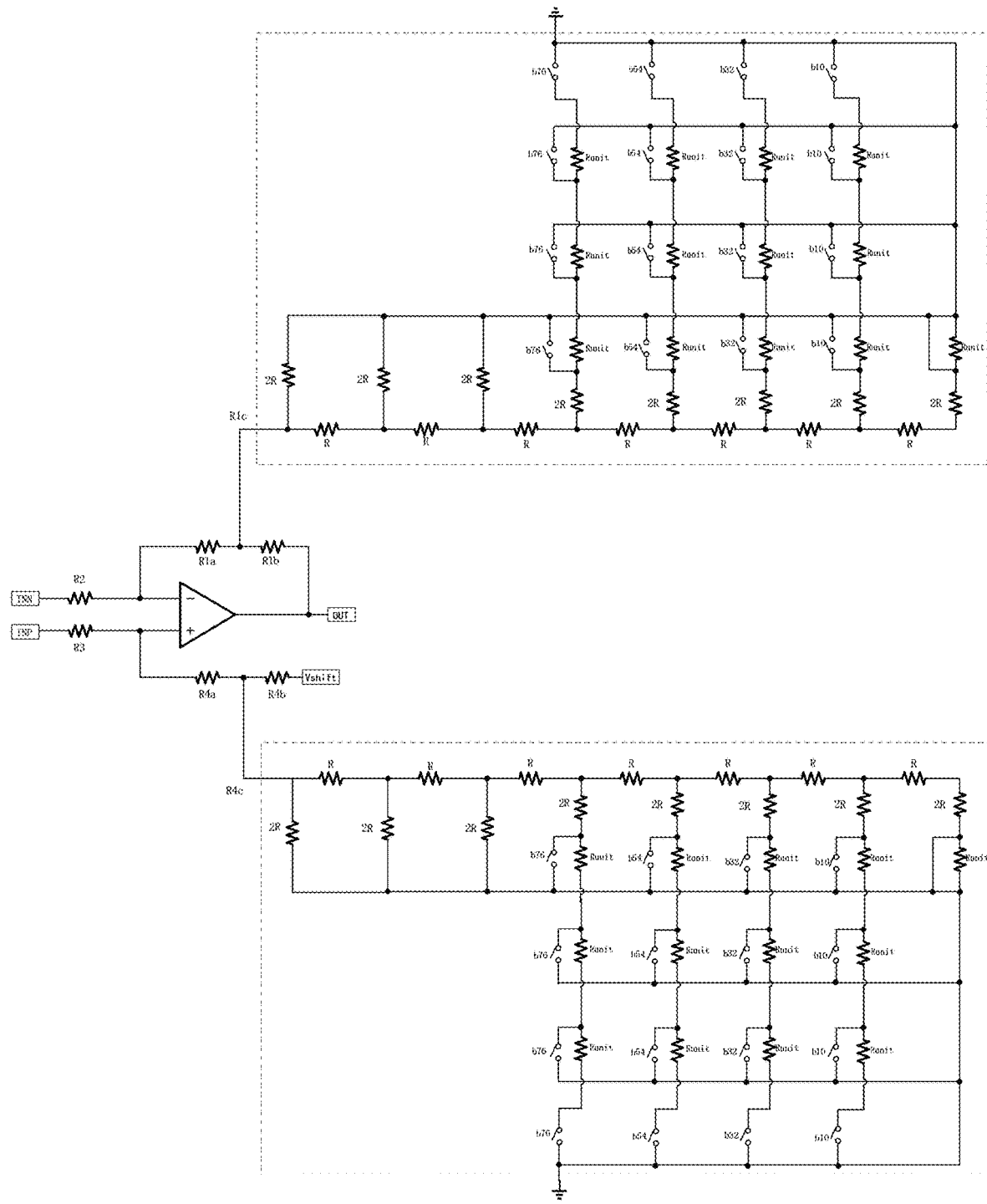
FIG. 11 shows a circuit diagram of a differential amplifier and trimming circuit thereof in another embodiment of the present invention.

FIG. 11 shows a final preferred example diagram of a differential amplifier and trimming circuit thereof in another embodiment of the present application. The trimming circuit has 9-bit trimming in total, which can ensure and achieve higher trimming accuracy. Wherein, the trimming circuit comprises resistors R1$c$ and R4$c$. The resistors R1$c$ and R4$c$ comprises a 6-order R-2R resistive network. The branches of low 4-bit are connected in series with three trimming resistors with identical resistance value, that is, each branch achieves 2-bit trimming and 8-bit trimming in total. In addition, the trimming circuit in FIG. 11 also comprises a 1-bit polarity control bit (not shown in the figure). When the polarity control bit is at 0, the resistor R1c is adjusted; when the polarity control bit is at 1, the resistor R4c is adjusted.

It should be noted that all or any of the embodiments described above can be combined with each other, unless otherwise stated or such embodiments may be mutually exclusive in terms of functionality and/or architecture.

It should be noted that in the application documents of the present patent, relational terms such as first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a plurality of elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In the application file of this patent, if it is mentioned that an action is performed according to an element, it means the meaning of performing the action at least according to the element, and includes two cases: the behavior is performed only on the basis of the element, and the behavior is performed based on the element and other elements. Multiple, repeatedly, various, etc., expressions include 2, twice, 2 types, and 2 or more, twice or more, and 2 types or more types.

All documents mentioned in the application are considered to be included in the application of the disclosure as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

In some cases, the actions or steps described in the claims can be performed in a different order than in the embodiments and still achieve desired results. In addition, the processes depicted in the drawings do not necessarily require the specific order or sequential order shown in order to achieve the desired results. In some embodiments, multitasking and parallel processing are also possible or may be advantageous.

What is claimed is:

1. A trimming circuit of differential amplifier, wherein,
   an output terminal of the differential amplifier is coupled to a first input terminal of the differential amplifier through a first voltage-dividing resistor;
   a shift voltage is coupled to a second input terminal of the differential amplifier through a second voltage-dividing resistor;
   the first voltage-dividing resistor and the second voltage-dividing resistor are respectively formed to be a T-shaped resistor network structure;
   the T-shaped resistor network structure comprises:
   a k-bit resistive network coupled to a T-shaped node and a reference power supply terminal, wherein a low n-bits of the k-bit resistive network is a R-2R resistive network, and part of branches of the low n-bits are connected in series with at least one trimming resistor, and each trimming resistor is connected in parallel with a switch, wherein k and n are positive integers greater than or equal to 1, and k≥n.

2. The trimming circuit of claim 1, wherein a high (k−n)-bits of the k-bit resistive network is a R-2R resistive network, and branches of the low n-bits are connected in series with one trimming resistor, and resistance values of the trimming resistors are sequentially set to $Rtrim/2^{n-1}$, wherein k≥n.

3. The trimming circuit of claim 1, wherein a high (k−n)-bits of the k-bit resistive network is a R-2R resistive network, and at least part of branches of the low n-bits is connected in series with three trimming resistors with identical resistance value, wherein n≥k/2.

4. The trimming circuit of claim 1, wherein a high (k−n)-bits of the k-bit resistive network is a R-2R resistive network, and at least part of branches of the low n-bits is connected in series with different bits trimming resistors with different resistance values.

5. The trimming circuit of claim 1, wherein the low n-bits of the k-bit resistive network is the R-2R resistive network, and a high (k−n)-bits of the k-bit resistive network is a plurality of resistors connected in parallel.

6. The trimming circuit of claim 1, wherein the low n-bits of the k-bit resistive network is the R-2R resistive network, and a high (k−n)-bits of the k-bit resistive network is a plurality of resistors connected in parallel and each branch of the high (k−n)-bits is connected in series with different bits trimming resistors, and each trimming resistor is connected in parallel with a switch.

7. The trimming circuit of claim 1, wherein the switch is a MOS transistor.

8. The trimming circuit of claim 1, wherein the T-shaped resistor network structure of the first voltage-dividing resistor further comprises: a first resistor connected between the T-shaped node and the first input terminal; and a fifth resistor connected between the T-shaped node and the output terminal.

9. The trimming circuit of claim 1, wherein the T-shaped resistor network structure of the second voltage-dividing resistor further comprises: a fourth resistor connected between the T-shaped node and the second input terminal; and a seventh resistor connected between the T-shaped node and the shift voltage.

* * * * *